(12) United States Patent
Nakayama

(10) Patent No.: US 9,281,581 B2
(45) Date of Patent: Mar. 8, 2016

(54) WIRING MODULE FOR A BATTERY MODULE THAT HAS DETECTION TERMINAL FOR DETECTING STATE OF ELECTRIC CELLS

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventor: Osamu Nakayama, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 3 days.

(21) Appl. No.: 14/371,908

(22) PCT Filed: Dec. 26, 2012

(86) PCT No.: PCT/JP2012/083602
§ 371 (c)(1),
(2) Date: Jul. 11, 2014

(87) PCT Pub. No.: WO2013/105435
PCT Pub. Date: Jul. 18, 2013

(65) Prior Publication Data
US 2015/0024634 A1 Jan. 22, 2015

(30) Foreign Application Priority Data
Jan. 12, 2012 (JP) ................................ 2012-004143

(51) Int. Cl.
*H01R 24/00* (2011.01)
*H01R 33/00* (2006.01)
(Continued)

(52) U.S. Cl.
CPC .......... *H01R 11/288* (2013.01); *B60L 11/1879* (2013.01); *H01M 2/206* (2013.01);
(Continued)

(58) Field of Classification Search
CPC ... H01R 11/288; H01R 11/28; H01M 10/482; H01M 2220/20; H01M 2/1077; B60L 11/1877; G01R 31/3696
USPC .................................................. 439/627, 500
See application file for complete search history.

(56) References Cited

U.S. PATENT DOCUMENTS 8,449,333 B2 * 5/2013 Ikeda et al. ................... 439/627
2011/0008669 A1 1/2011 Ogasawara et al.
(Continued)

FOREIGN PATENT DOCUMENTS

| EP | 2 487 737 A1 | 8/2012 |
|---|---|---|
| JP | A-2010-170884 | 8/2010 |

(Continued)

OTHER PUBLICATIONS

Jun. 1, 2015 European Search Report in European Application No. 12865023.1.

(Continued)

*Primary Examiner* — Javaid Nasri
(74) *Attorney, Agent, or Firm* — Oliff PLC

(57) ABSTRACT

A wiring module includes first detection terminals for detecting a state of electric cells, and a resin protector that retains the first detection terminals. The first detection terminals each include a first plate-shaped portion having a plate shape, and a first electric wire connecting portion continuous with the first plate-shaped portion and connected to a terminal portion of an electric wire W. The first plate-shaped portion is provided with projecting pieces for discriminating the front and back sides of the corresponding first detection terminal.

8 Claims, 13 Drawing Sheets

(51) Int. Cl.
- *H01R 11/28* (2006.01)
- *H01M 2/20* (2006.01)
- *H01M 10/48* (2006.01)
- *B60L 11/18* (2006.01)
- *G01R 31/36* (2006.01)
- *H01M 2/10* (2006.01)

(52) U.S. Cl.
CPC ......... *H01M10/482* (2013.01); *G01R 31/3696* (2013.01); *H01M 2/1077* (2013.01); *H01M 2220/20* (2013.01)

(56) References Cited

U.S. PATENT DOCUMENTS

2012/0015550 A1   1/2012   Ikeda et al.
2012/0231640 A1   9/2012   Ikeda et al.

FOREIGN PATENT DOCUMENTS

| JP | A-2011-18499 | 1/2011 |
| JP | A-2011-124176 | 6/2011 |
| JP | A-2012-003927 | 1/2012 |
| WO | WO 2011/021614 A1 | 2/2011 |
| WO | WO 2011/043261 A1 | 4/2011 |
| WO | 2011/108513 A1 | 9/2011 |

OTHER PUBLICATIONS

International Search Report issued in International Patent Application No. PCT/JP2012/083602 dated Mar. 19, 2013.

\* cited by examiner

WIRING MODULE FOR A BATTERY MODULE THAT HAS DETECTION TERMINAL FOR DETECTING STATE OF ELECTRIC CELLS

CROSS-REFERENCE TO RELATED APPLICATIONS

This is a National Stage of PCT/JP2012/083602 filed Dec. 26, 2012, which claims priority to Japanese Patent Application No. 2012-004143 filed Jan. 12, 2012. The entire disclosure of each of the prior applications is hereby incorporated by reference herein in its entirety.

BACKGROUND

In a battery module for an electric vehicle or a hybrid vehicle, a plurality of electric cells each having positive and negative electrode terminals are lined up in a row, and the electric cells are connected in series or in parallel as a result of the electrode terminals of adjacent electric cells being connected to each other by bus bars (connecting members) (see Patent Document 1).

In a bus bar module (wiring module) in Patent Document 1, voltage detection terminals each having a flat plate-shaped bus bar connecting portion and an electric wire attaching portion attached to an electric wire are laid on a bus bar, and detect whether the voltage of the electric cells is kept within a predetermined range on a battery ECU side, due to the electric wires connected to these voltage detection terminals being led to the battery ECU.

CITATION LIST

Patent Documents

Patent Document 1: JP 2010-170884A

SUMMARY

Incidentally, in general, a voltage detection terminal (detection terminal) of this kind is formed so as to be flat on one surface side, a portion connected to the electric wire projects on the other surface side, and the flat surface side is placed on an attached portion. In other words, the detection terminal, which has front and back sides, needs to be attached such that the front and back sides come at respectively appropriate positions. If the front and back sides are attached in a reversed manner, a force is applied to the portion connected to the electric wire, and the reliability in connection possibly decreases.

On the other hand, although discrimination of the front and back sides of the detection terminal can be discriminated based on the shape of the portion connected to the electric wire, it is likely with this method that the front and back sides are incorrectly determined. In addition, a problem arises in that even if the front and back sides are disposed in a reversed manner by mistake, it is not easy to determine the mistake.

The present application is completed based on the foregoing situation, and an object of exemplary embodiments is to provide a wiring module with which front and back sides of a detection terminal can be prevented from being attached incorrectly.

Solution to Problem

Exemplary embodiments are directed to a wiring module to be attached to a battery module in which adjacent electrode terminals of a plurality of electric cells having positive and negative electrode terminals are connected by connecting members, the wiring module including: a detection terminal for detecting a state of the electric cells; and a resin protector that retains the detection terminal, wherein the detection terminal includes a plate-shaped portion having a plate shape, and an electric wire connecting portion continuous with the plate-shaped portion and connected to a terminal portion of an electric wire, and the plate-shaped portion is provided with a front-back discriminating means for discriminating front and back sides of the detection terminal.

With this configuration, since the front and back sides of the detection terminal can be discriminated by the front-back discriminating means, the front and back sides of the detection terminal can be prevented from being attached incorrectly. Furthermore, since the front and back sides of the detection terminal can be discriminated, the workability in the operation of attaching the detection terminal can be improved.

It is preferable to have the following configurations as modes for carrying out the above configuration.

The front-back discriminating means is a projecting portion that projects with respect to a surface of the plate-shaped portion.

With this configuration, the front-back discriminating means can be easily formed.

The projecting portion is a plate-shaped projecting piece that projects with respect to the surface of the plate-shaped portion.

With this configuration, the front-back discriminating means can be further easily formed.

The detection terminal is provided with an insertion hole for fastening with a fastening member, the insertion hole penetrating the detection terminal, and the projecting portion is formed outside an area of a fastening tool for fastening the fastening member.

With this configuration, when the fastening tool fastens the fastening member, the fastening tool can be prevented from coming into contact with the projecting portion, regardless of the projecting dimension of the projecting portion.

The plate-shaped portion is rectangular, and the projecting portion is formed at a corner portion of the plate-shaped portion, the resin protector is provided with a partition wall that partitions the connecting members from the outside, and the partition wall is provided with a bulging portion that bulges toward the outside, and inside of which the corner portion is disposed.

With this configuration, the inside of the bulging portion that is likely to be an area with which the fastening tool does not come into contact can be used as a space for disposing the projecting portion.

The projecting portion is provided in the plate-shaped portion at a position on the electric wire connecting portion side.

With this configuration, since the electric wire connecting portion side can be uplifted by the projecting portion, incorrect attachment can be easily discriminated.

The detection terminal is provided with an insertion hole for fastening with a fastening member, the insertion hole penetrating the detection terminal, and a projecting dimension of the projecting portion is set to a dimension with which the projecting portion does not abut against a fastening tool for fastening the fastening member.

With this configuration, when the fastening tool fastens the fastening member, the fastening tool can be prevented from coming into contact with the projecting portion.

The resin protector is provided with a passage groove through which a passing portion constituted by at least one of the terminal portion of the electric wire and the electric wire connecting portion is passed, and a retaining piece that retains the passing portion within the passage groove, and if the detection terminal is mounted upside down, the passing portion is disposed at a position where the passing portion is not retained within the passage groove.

With this configuration, if the passing portion is disposed at a position where the passing portion is not retained within the passage groove, it can be discriminated that the front and back sides of the detection terminal have been attached in a reversed manner.

The resin protector is provided with a retaining portion that retains the connecting members and the detection terminal, and the detection terminal is laid on the corresponding connecting member.

With this configuration, since the detection terminal is laid on the corresponding connecting member, the detection terminal is uplifted by the projecting portion when the detection terminal is mounted upside down, and incorrect attachment can be easily detected.

Furthermore, since the connecting members are retained by the wiring module, the detection terminal and the connecting members can be collectively attached to the electric cells (as compared with the case of separately attaching the connecting members), and the workability in the attaching operation can be improved.

The front and back sides of the detection terminal in the wiring module can be prevented from being attached incorrectly.

DETAILED DESCRIPTION OF THE EMBODIMENTS

Embodiment 1

Embodiment 1 will be described below with reference to FIGS. 1 to 8.

Figure 1:
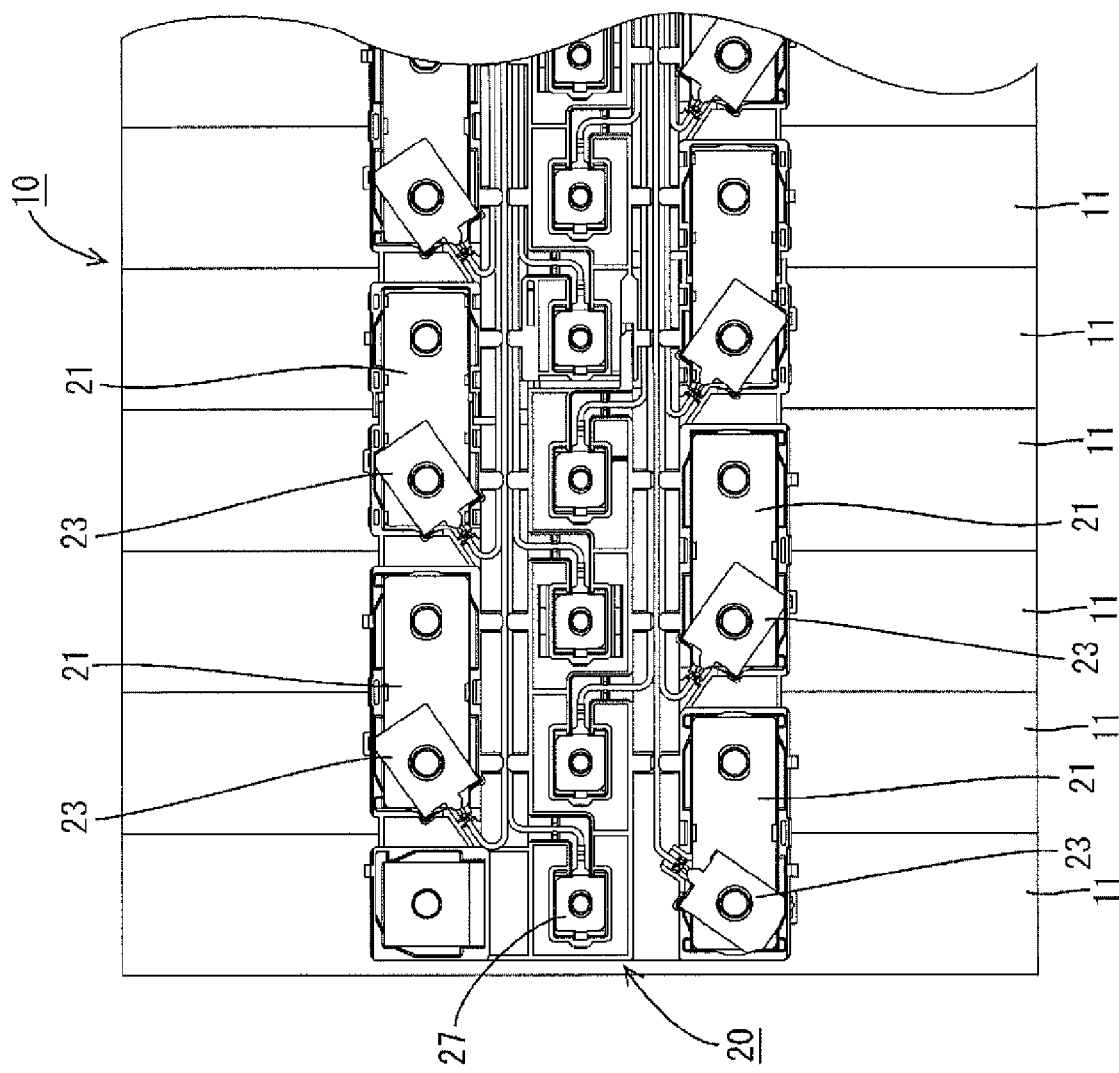
FIG. 1 is a plan view of a battery module to which a wiring module in Embodiment 1 is attached, omitting a part of the battery module.

As shown in FIG. 1, a wiring module 20 in the present embodiment is attached to an electric cell group constituted by a plurality of arranged electric cells 11, and is part of a battery module 10. The battery module 10 is used as a driving source of an electric vehicle or a hybrid vehicle, for example. In the following description, the vertical direction in FIG. 5 will be taken as a reference vertical direction, and, regarding the front-rear direction, the front side and the rear side will refer respectively to the lower side and the upper side in FIG. 1.

Battery Module

The battery module 10 includes a plurality of electric cells 11 that are stacked along the horizontal direction, and a wiring module 20 attached to the electric cells 11.

Figure 2:
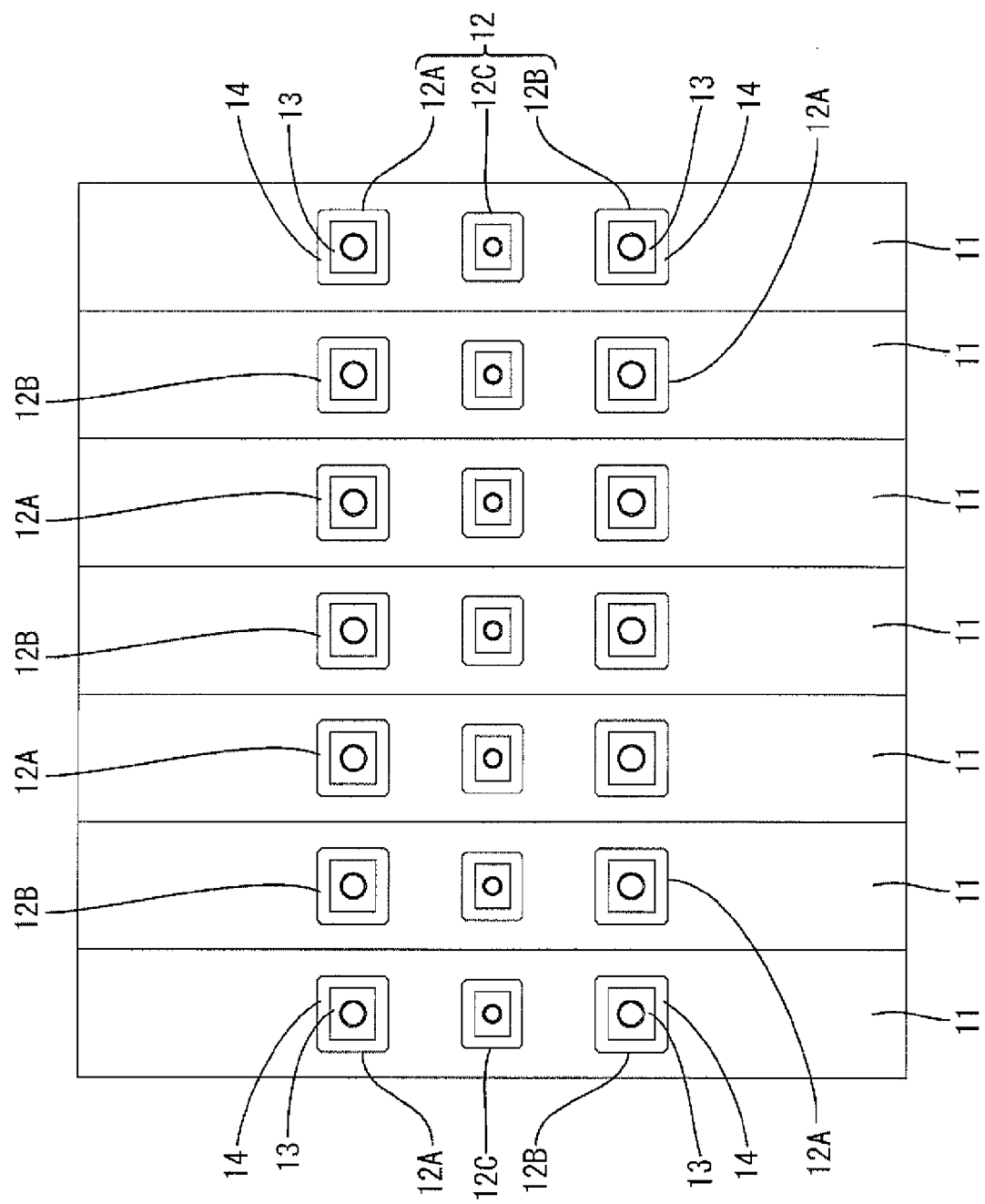
FIG. 2 is a plan view of a plurality of electric cells.

As shown in FIG. 2, each electric cell 11 has terminals 12A to 12C that project vertically from an end surface of a rectangular-parallelepiped body portion of the electric cell in which an electricity generating element (not shown) is accommodated.

The terminals 12A to 12C are electrode terminals 12A, 12B (shown as a positive electrode 12A and a negative electrode 12B) and a battery-side detection terminal 12C disposed in an intermediate portion between the electrode terminals 12A and 12B.

All terminals 12A to 12C have a nut shape with a screw hole at the center, and are each constituted by a metallic conductive portion 13 and a resin portion 14 that circumferentially surround the conductive portion 13. In the upper end portion (tip portion) of the terminals 12A to 12C, the conductive portion 13 projecting upward by a predetermined dimension from the upper end of the resin portion 14 is exposed. The upper end surface (tip surface) of the conductive portion 13 has a flat rectangular shape.

The electric cells 11 are disposed such that the polarities (orientations of the positive and negative electrodes) of the adjacent electric cells 11 are opposite, and are thereby configured such that the electrode terminals 12A, 12B with opposite polarities are adjacent to each other. The electric cells 11 are fixed by a retaining plate (not shown).

Wiring Module

Figure 3:
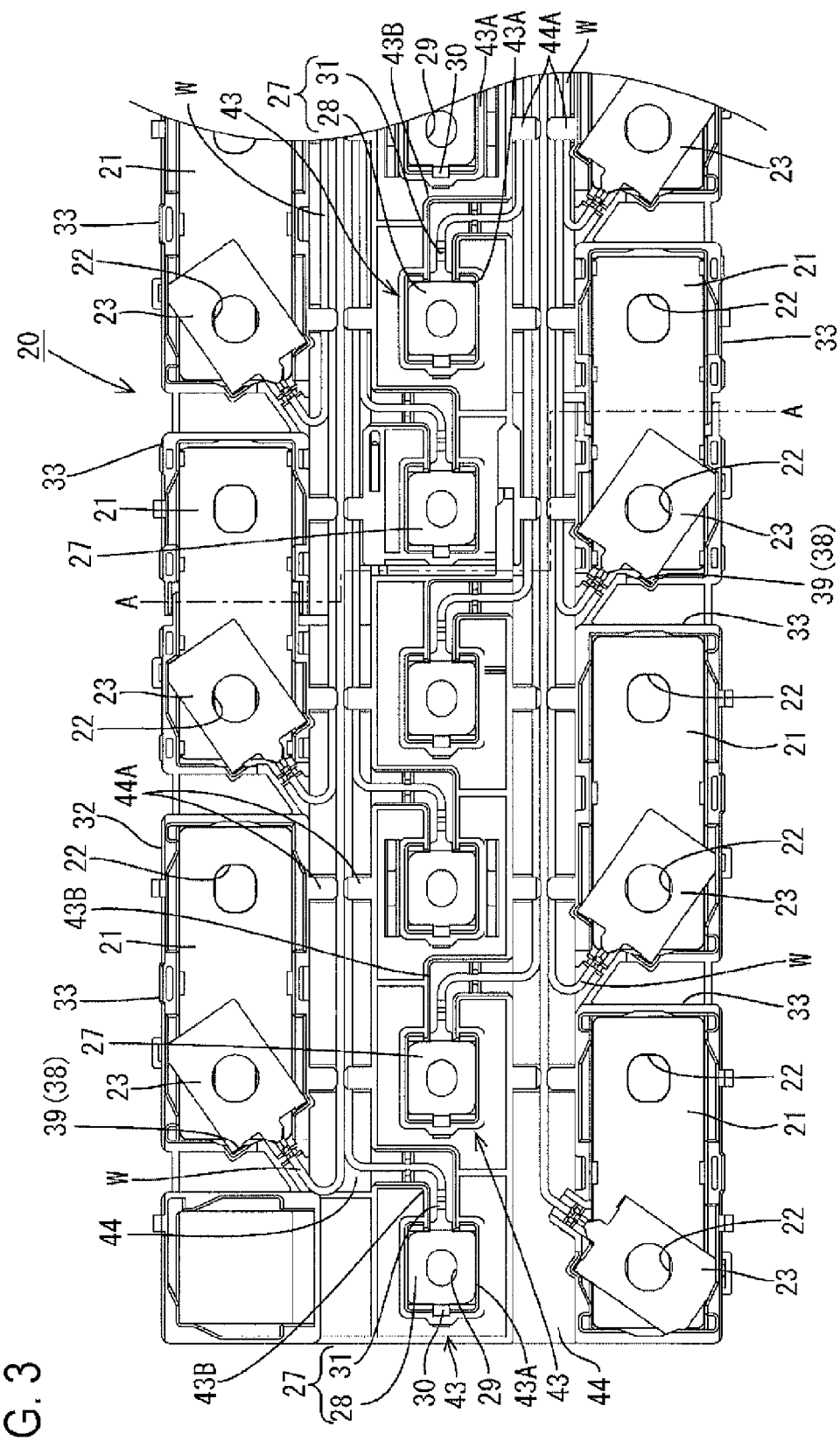
FIG. 3 is a plan view of the wiring module, omitting a part thereof.

As shown in FIG. 3, the wiring module 20 includes a plurality of connecting members 21 connecting the electrode terminals 12A, 12B that are adjacent in the direction from left to right, a plurality of first detection terminals 23 (an example of a "detection terminal,") that are laid on the respective connecting members 21, are connected to terminal portions of respective electric wires W, and detect a voltage of the electric cells 11, a plurality of second detection terminals 27 connected to terminal portions of respective electric wires W and disposed at positions different from those of the connecting members 21, and a resin protector 32 that is made of synthetic resin and accommodates the connecting members 21, the first detection terminals 23, and the second detection terminals 27.

Connecting Member

The connecting members 21 are made of metal such as copper, copper alloy, or aluminum, have a generally rectangular plate shape, and each have a pair of insertion holes 22, 22 in which shaft portions of bolts BT, each serving as a fastening member, are inserted. The insertion holes 22, 22 have an oval shape elongated in the direction from left to right.

First Detection Terminal

Hereinafter, regarding the direction of the first detection terminals 23, the front side and the rear side thereof correspond respectively to the right side and the left side in FIG. 6, and the axial direction of the first detection terminals 23 corresponds to the axial direction of respective portions connected to the electric wires W.

The first detection terminals 23 are provided in order to detect a voltage of the electrode terminals 12A, 12B of the electric cells 11.

Figure 6:
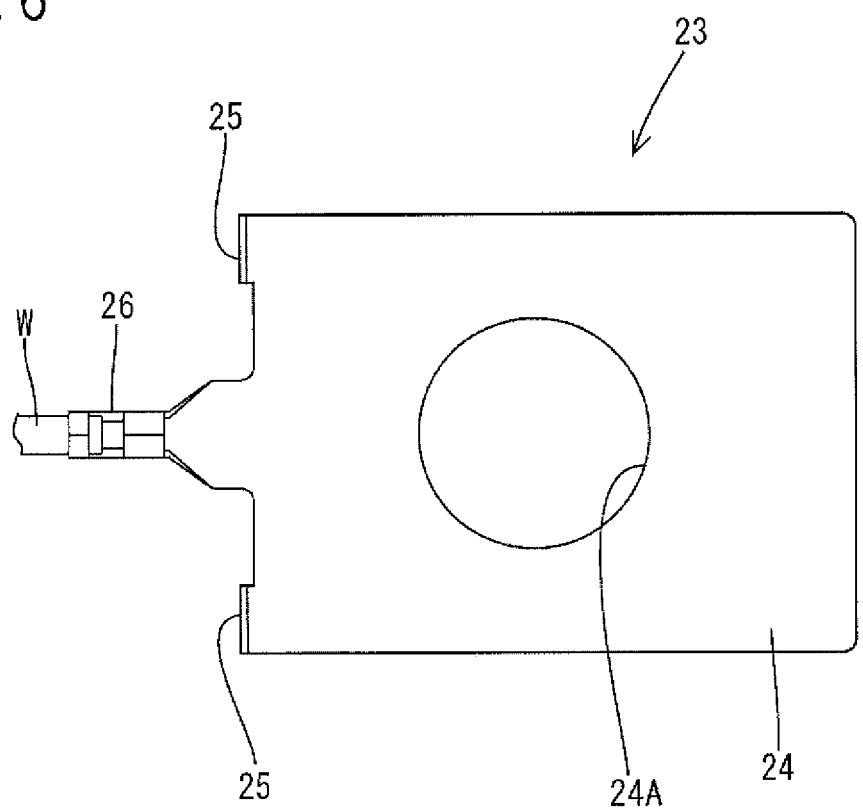
FIG. 6 is a plan view of the first detection terminal.

As shown in FIG. 6, the first detection terminals 23 are each constituted by a first plate-shaped portion 24 (an example of a "plate-shaped portion") having a flat plate shape, and a first electric wire connecting portion 26 (an example of an "electric wire connecting portion,") that is continuous with the first plate-shaped portion 24 and is press-fit to the terminal portion of the corresponding electric wires W.

The first plate-shaped portion 24 has a rectangular shape elongated in the axial direction of the terminal portion of the corresponding electric wire W, and a circular insertion hole 24A penetrates the center of the first plate-shaped portion 24.

A pair of projecting pieces 25, 25 erected from each first plate-shaped portion 24 are formed at both end portions (corner portions) in the width direction at the trailing edge of the first plate-shaped portion 24.

Figure 5:
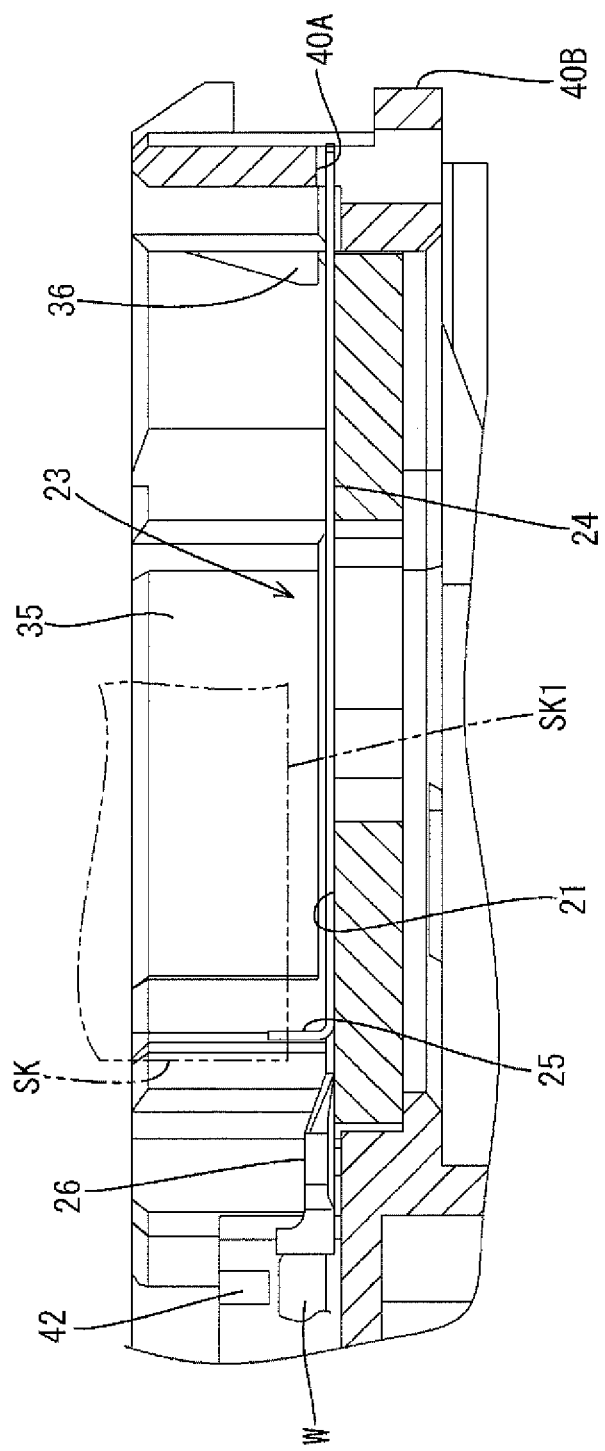
FIG. 5 is a diagram showing a cross-section taken along line B-B in FIG. 4.
Figure 7:
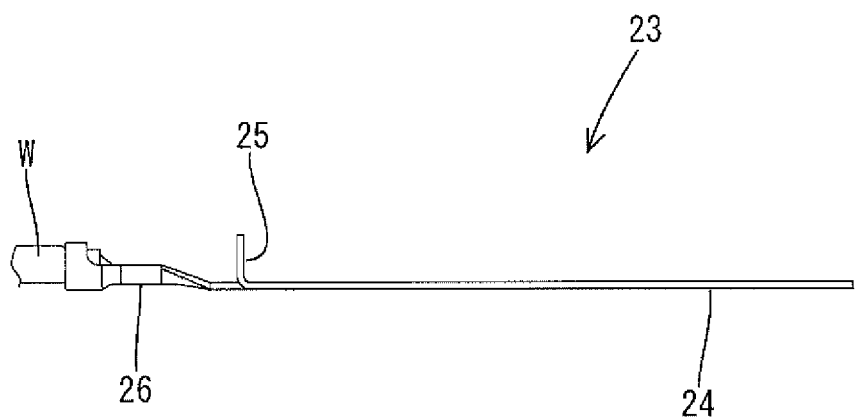
FIG. 7 is a side view of the first detection terminal.

As shown in FIG. 7, each projecting piece 25 is a rectangular plate piece erected at a right angle with respect to the plate surface of the first plate-shaped portion 24 and is formed integrally with the first plate-shaped portion 24. The height dimension of the projecting pieces 25 is set such that the projecting pieces 25 project upward, higher than a lower end position SK1 to which a socket SK (the outer surface of the socket is indicated by a chain line) for fastening a bolt can be lowered, as shown in FIG. 5, when the first plate-shaped portion 24 is mounted at a predetermined position in the wiring module 20.

An uplift of the first detection terminal 23 when mounted upside down is thus increased by setting a large projecting dimension of the projecting pieces 25 (so as to be higher than the lower end position SK1 of the socket).

The first electric wire connecting portion 26 is press-fit to the conductive portion of the corresponding electric wire W, which is exposed by peeling off insulating coating of a terminal of the electric wire W that is a coated electric wire, and has a wire barrel that crimps and press-fits the conductive portion of the electric wire W and an insulation barrel that retains the electric wire W by crimping the electric wire W from above the insulating coating.

Each first detection terminal 23 is formed by punching and bending a metal plate material using a pressing machine, disposed such that the axial direction thereof is aligned with a direction in which the first detection terminal 23 is inclined with respect to the connecting direction of the corresponding connecting member 21 (FIG. 4), and is fastened such that a bolt BT serving as a fastening member (the outer periphery of the head of the bolt is indicated by a chain line) holds the connecting member 21 and the first detection terminal 23 with respect to the electrode terminals 12A, 12B.

Second Detection Terminal

The second detection terminals 27 are for detecting voltage in an intermediate portion of the electric cells 11, and are each constituted by a second plate-shaped portion 28 having a flat plate shape and a second electric wire connecting portion 31 continuous with an end portion of the second plate-shaped portion 28 and connected to a terminal of the corresponding electric wire W, as shown in FIG. 3.

The second plate-shaped portion 28 is a portion that comes into contact with the conductive portion 13 of the battery-side detection terminal 12C of the corresponding electric cell 11, and has a rectangular shape whose area is smaller than that of the first plate-shaped portion 24, A circular insertion hole 29 into which the shaft portion of a bolt BT can be inserted penetrates the center of the second plate-shaped portion 28.

An interlocking piece 30 projects from a tip portion of the second plate-shaped portion 28.

The second electric wire connecting portion 31 is press-fit to a conductor exposed by peeling off insulating coating of a terminal of the corresponding electric wire W, which is a coated electric wire, and has a wire barrel that crimps and press-fits the conductive portion of the electric wire W and an insulation barrel that retains the electric wire W by crimping the electric wire W from above the insulating coating.

All electric wires W continuous with the first detection terminals 23 and the second detection terminals 27 are gathered into electric wire arranging grooves 44 in the later-described resin protector 32, and are guided to a battery ECU (not shown) on the right side (one side in the arranging direction of the connecting members 21 and the second detection terminals 27). This battery ECU may have a known configuration in which a microcomputer, elements, and the like are mounted, and functions for detecting voltage, current, temperature, and the like of the electric cells 11 and performing charging/discharging control and the like for each electric cell 11 are provided.

Resin Protector

As shown in FIG. 3, the resin protector 32 has a plurality of retaining portions 33 that retain the connecting members 21, a plurality of detection accommodating portions 43 that accommodate the second detection terminals 27, and the electric wire arranging grooves 44 through which the electric wires W continuous with the second detection terminals 27 and the first detection terminals 23 are passed.

The retaining portions 33 are lined up from left to right on the front and back sides of the resin protector 32, and each have a bottom plate (not shown) on which the corresponding connecting member 21 is placed, and a partition wall 35 formed so as to enclose the connecting member 21, as shown in FIG. 5.

The bottom plate is coupled to the partition wall 35 only at an intermediate portion in the width direction, but is not formed on both sides of the bottom plate in the intermediate portion so as to form opening portions through which the electrode terminals 12A, 12B can enter.

The partition wall 35 is installed in an erected manner in a ring shape around the corresponding connecting member 21, surrounding the connecting member 21 at a height that prevents the connecting member 21 from coming into contact with a tool or the like, in order to prevent the tool or the like from coming into contact with the fastening member such as the bolt BT or the connecting member 21 and making a short circuit.

Figure 4:
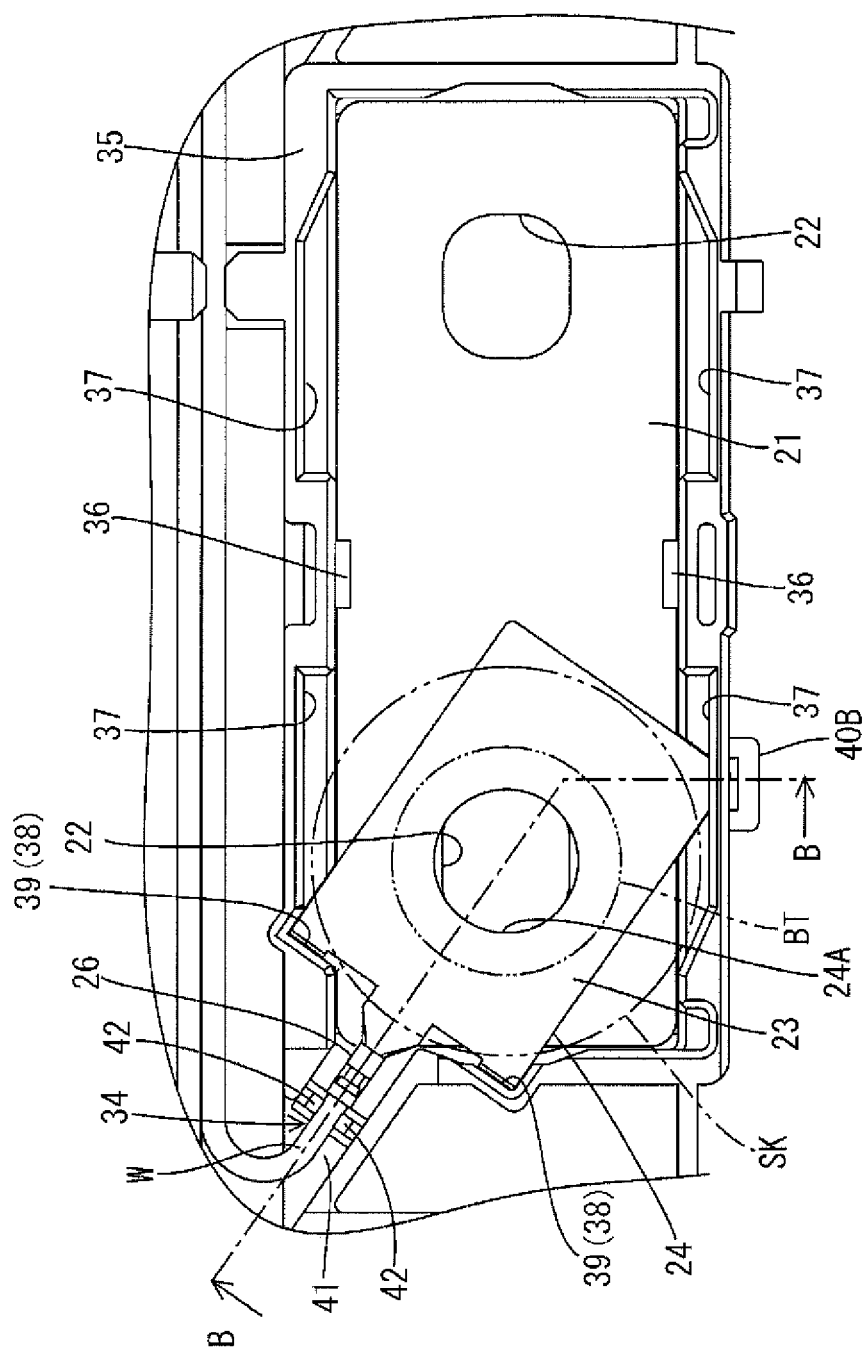
FIG. 4 is a diagram showing an enlargement of a retaining portion in which a connecting member and a first detection terminal are retained.

As shown in FIG. 4, the partition wall 35 is provided with dislodgment preventing pieces 36 capable of undergoing bent deformation in the front-rear direction. The connecting member 21 is disposed below pawls of the dislodgment preventing pieces 36, and dislodgment of the connecting member 21 is thereby prevented.

The partition wall 35 is also provided with a thinned portion 37 obtained by trimming and thinning the inner surface side thereof, such that it does not abut against the socket SK.

Furthermore, the partition wall 35 is provided with a fitting portion 38 into which corner portions of the first plate-shaped portion 24 of the corresponding first detection terminal 23 are fitted.

The fitting portion 38 has a plurality of bulging portions 39 that bulge around a corner portion of the first plate-shaped portion 24 so as to enable the first plate-shaped portion 24 to be fitted into the fitting portion 38 from above, and a passage hole 40A that penetrates the partition wall 35 and into which another corner portion of the first plate-shaped portion 24 is inserted.

An auxiliary wall 40B that protects the corner portion of the first plate-shaped portion 24 is provided on the outer surface side of the passage hole 40A.

A passage groove 41 through which a passing portion 34 constituted by the first electric wire connecting portion 26 of the corresponding first detection terminal 23 and the terminal portion of the corresponding electric wire W is passed is installed in a recessed manner at a corner portion of each retaining portion 33. A pair of retaining pieces 42, 42 are formed in the upper end portion of the passage groove 41 in order to retain, within the passage groove 41, the connecting portion between the first electric wire connecting portion 26 and the electric wire W. This passage groove 41 causes the electric wire W to join the corresponding electric wire arranging groove 44 in an inclined direction.

Detection Accommodating Portion

As shown in FIG. 3, the detection accommodating portions 43 are lined up from left to right in an intermediate portion of the resin protector 32 in the front-rear direction, and each detection accommodating portion 43 has a partition wall 43A that partitions the second detection terminal 27 from the outside, and an opening portion (not shown) that is provided below the second detection terminal 27 and through which the voltage detection terminal 12C can enter.

In the partition wall 43A, an interlocking hole (not shown) in which the interlocking piece 30 of the second detection terminal 27 is inserted and that interlocks the second detection terminal 27 such that the second detection terminal 27 is not dislodged is formed in a penetrating manner.

A passage groove 43B that divides the partition wall 43A and guides the corresponding electric wire W to an electric wire arranging path is formed in each detection accommodating portion 43.

The passage groove 43B is bent such that the passage grooves 43B of the detection accommodating portions 43 that are adjacent from left to right guide the electric wires W alternately to the front electric wire arranging groove 44 and the rear electric wire arranging groove 44.

Two electric wire arranging grooves 44 are provided respectively on the front and rear side of the detection accommodating portions 43 that are arranged from left to right, and a pair of pawl portions 44A for retaining the electric wires W within the electric wire arranging grooves 44 are disposed facing each other above the electric wire arranging grooves 44.

Note that this resin protector 32 is constituted by a plurality of coupling units (a boundary between the coupling units is indicated by line A-A in FIG. 3), and the coupling units are coupled via the connecting members 21. When these coupling units are coupled in the direction from left to right, the electric wire arranging grooves 44 in the adjacent coupling units become continuous with each other.

Next, assembly of the wiring module 20 will be described.

The resin protector 32 is formed by connecting the coupling units in the direction from left to right.

Next, the connecting members 21 are placed on the bottom plates of the retaining portions 33 and retained within the retaining portions 33, a corner portion of the first plate-shaped portion 24 of each first detection terminal 23 connected to the terminal of the corresponding electric wire W is fitted into the corresponding fitting portion 38, the connecting portion between the first electric wire connecting portion 26 and the terminal of the electric wire W is passed through between the pair of retaining pieces 42, 42 so as to be accommodated in the passage groove 41, and the first detection terminal 23 is thereby mounted in the resin protector 32 (FIG. 4).

Figure 8:
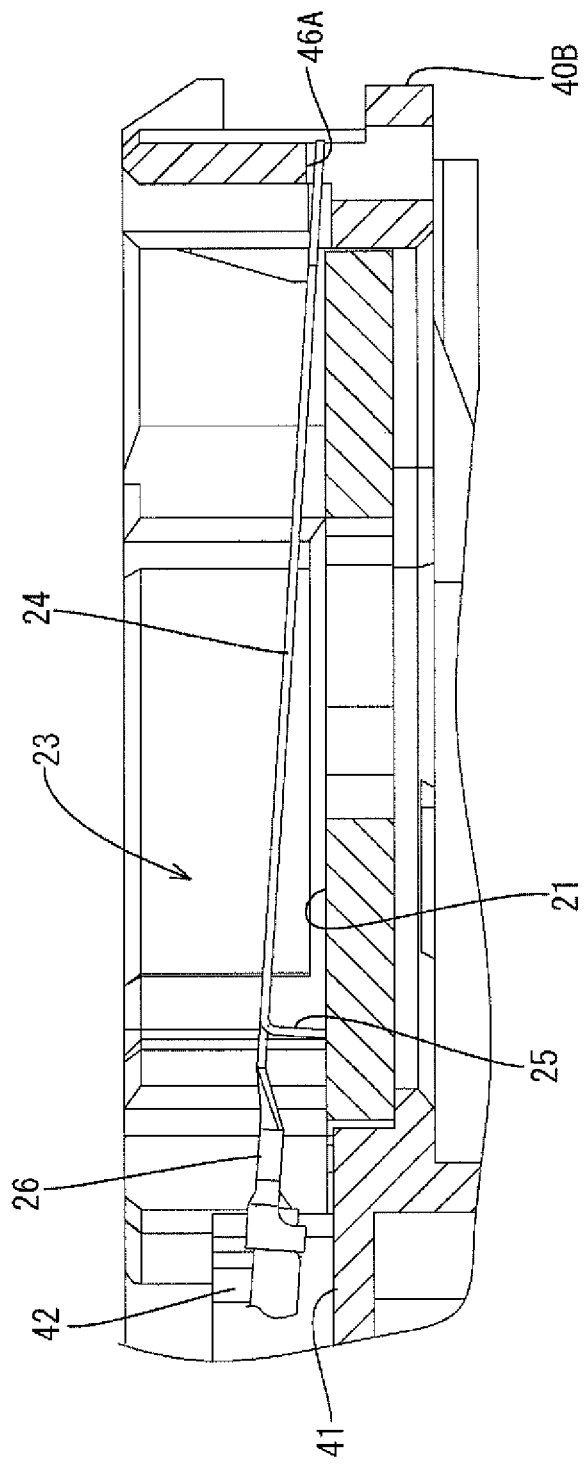
FIG. 8 is a diagram showing a state where the first detection terminal is mounted upside down.

Here, if the first detection terminal 23 is mounted upside down, the first electric wire connecting portion 26 side of the first detection terminal 23 is uplifted with respect to the bottom surface of the passage groove 41 in accordance with the height dimension of the pair of projecting pieces 25, as shown in FIG. 8. Thus, the connecting portion between the electric wire W and the first electric wire connecting portion 26 is not accommodated between the passage groove 41 and the pair of retaining pieces 42, 42, and the connecting portion between the electric wire W and the first electric wire connecting portion 26 protrudes outward of the pair of retaining pieces 42, 42. Thus, it can be easily visually discriminated that the first detection terminal 23 is mounted upside down.

Next, the electric wires W extending rearward of the first electric wire connecting portions 26 are arranged in the electric wire arranging grooves 44.

Furthermore, the second detection terminals 27 are accommodated in the detection accommodating portions 43, and the electric wires W connected to the second electric wire connecting portions 31 are accommodated in the electric wire arranging grooves 44.

After the mounting of all connecting members 21, first detection terminals 23, and second detection terminals 27 is complete, the wiring module 20 is formed (FIG. 3).

Next, the wiring module 20 is attached to the electric cells 11, the shaft portions of the bolts are passed through the insertion holes 22, 24A, and 29 of the connecting members 21, the first detection terminals 23, and the second detection terminals 27 such that the bolts are fastened, and the battery module 10 is thereby formed (FIG. 1).

According to the configuration in the above embodiment, the following effects are achieved.

(1) The wiring module 20, which is to be attached to the battery module 10 in which adjacent electrode terminals 12A, 12B of the plurality of electric cells 11 having positive and negative electrode terminals 12A, 12B are connected by the connecting members 21, includes: the first detection terminals 23 (detection terminal) for detecting voltage (a state) of the electric cells 11; and the resin protector 32 that retains the first detection terminals 23, wherein the first detection terminals 23 each include the first plate-shaped portion 24 (plate-shaped portion) having a plate shape, and the first electric wire connecting portion 26 (electric wire connecting portion) continuous with the first plate-shaped portion 24 and connected to the terminal portion of the corresponding electric wire W, and the first plate-shaped portion 24 is provided with the projecting pieces 25, 25 (front-back discriminating means) for discriminating the front and back sides of the corresponding first detection terminal 23.

According to the present embodiment, since the front and back sides of each first detection terminal 23 (detection terminal) can be discriminated using the projecting pieces 25, 25 (front-back discriminating means), incorrect attachment of the front and back sides of the first detection terminal 23 can be prevented. Furthermore, since the front and back sides of each first detection terminal 23 can be easily discriminated, the workability in the operation of attaching the first detection terminal 23 can be improved.

(2) The front-back discriminating means is the projecting portion that projects with respect to the surface of each first plate-shaped portion 24.

With this configuration, the front-back discriminating means can be easily formed.

(3) The projecting portion is plate-shaped projecting pieces 25, 25 that project with respect to the surface of each first plate-shaped portion 24.

With this configuration, the front-back discriminating means can be further easily formed.

(4) Each first detection terminal 23 is provided with the insertion hole 24A for fastening with the bolt BT (fastening member), the insertion hole 24A penetrating the first detection terminal 23, and the projecting pieces 25, 25 (projecting portion) are formed outside the area of the socket SK (fastening tool) for fastening the bolt BT.

With this configuration, when the socket SK fastens the bolt, the socket SK can be prevented from coming into contact with the projecting pieces 25, 25, regardless of the projecting dimension of the projecting pieces 25, 25 (projecting portion).

(5) The first plate-shaped portion 24 (plate-shaped portion) is rectangular, the projecting pieces 25, 25 (projecting portion) are formed at corner portions of the first plate-shaped portion 24, the resin protector 32 is provided with the partition walls 35 that partitions the connecting members 21 from the outside, and each partition wall 35 is provided with the bulging portions 39 that bulge toward the outside, and inside of which the corner portions are disposed.

With this configuration, the inside of the bulging portions 39, which is likely to be an area that the socket SK (fastening tool) does not contact, can be used as a space for disposing the projecting portion.

(6) The projecting pieces 25, 25 (projecting portion) are provided in the first plate-shaped portion 24 (plate-shaped portion) at positions on the first electric wire connecting portion 26 (electric wire connecting portion) side.

With this configuration, since the first electric wire connecting portion 26 (electric wire connecting portion) side can be uplifted by the projecting pieces 25, 25 (projecting portion), incorrect attachment can be easily discriminated.

(7) The resin protector 32 is provided with the passage groove 41 through which the passing portion 34 constituted by at least one of the terminal portion of the electric wire W and the first electric wire connecting portion 26 (electric wire connecting portion) is passed, and the retaining pieces 42, 42 that retain the passing portion 34 within the passage groove 41, and if the first detection terminal 23 is mounted upside down, the passing portion 34 is disposed at a position where the passing portion 34 is not retained within the passage groove 41.

With this configuration, if the passing portion 34 is disposed at a position where the passing portion 34 is not retained within the passage groove 41, it can be discriminated that the front and back sides of the first detection terminal 23 has been attached in a reversed manner.

(8) The resin protector 32 is provided with the retaining portions 33 that retain the connecting members 21 and the first detection terminals 23, and the first detection terminals 23 are laid on the connecting members 21.

With this configuration, since each first detection terminal 23 is laid on the corresponding connecting member 21, when the first detection terminal 23 is mounted upside down, the first detection terminal 23 is uplifted by the projecting pieces 25, 25 (projecting portion), and incorrect attachment can thereby be easily detected.

Furthermore, since the connecting members 21 are retained by the wiring module 20, the first detection terminals 23 and the connecting members 21 can be collectively attached to the electric cells 11 (as compared with the case of separately attaching the connecting members 21), and the workability in the attaching operation can be improved.

Embodiment 2

Embodiment 2 will be described with reference to FIGS. 9 to 12.

In Embodiment 1, the projecting pieces 25, 25 are provided outside the area that the socket SK enters. In contrast, in Embodiment 2, the projecting dimension of projecting pieces 47A, 47B is reduced and are provided within an area in which the socket SK is disposed. Hereinafter, the same configurations as those in Embodiment 1 will be given the same reference numerals, and the description thereof will be omitted.

Figure 11:
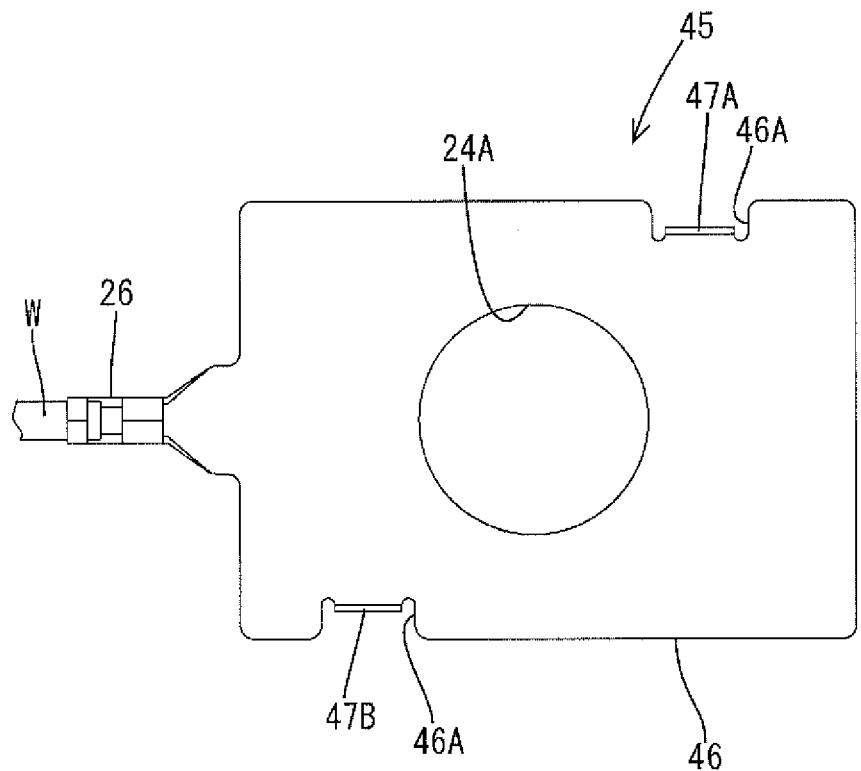
FIG. 11 is a plan view of the first detection terminal.
Figure 12:
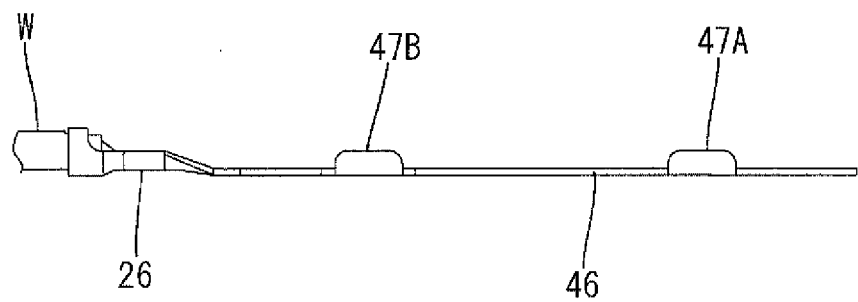
FIG. 12 is a side view of the first detection terminal.

As shown in FIG. 11, each first detection terminal 45 is provided with a pair of projecting pieces 47A, 47B erected substantially at a right angle with respect to the surface of a first plate-shaped portion 46, at respective side-edge portions of the first plate-shaped portion 46.

The pair of projecting pieces 47A, 47B are both provided at bottom ends of a pair of recess portions 46A provided on side edges of the first plate-shaped portion 46, one projecting piece 47A is provided on the leading end side of the first plate-shaped portion 46, and the other projecting piece 47B is provided on the trailing end side of the first plate-shaped portion 46.

Figure 9:
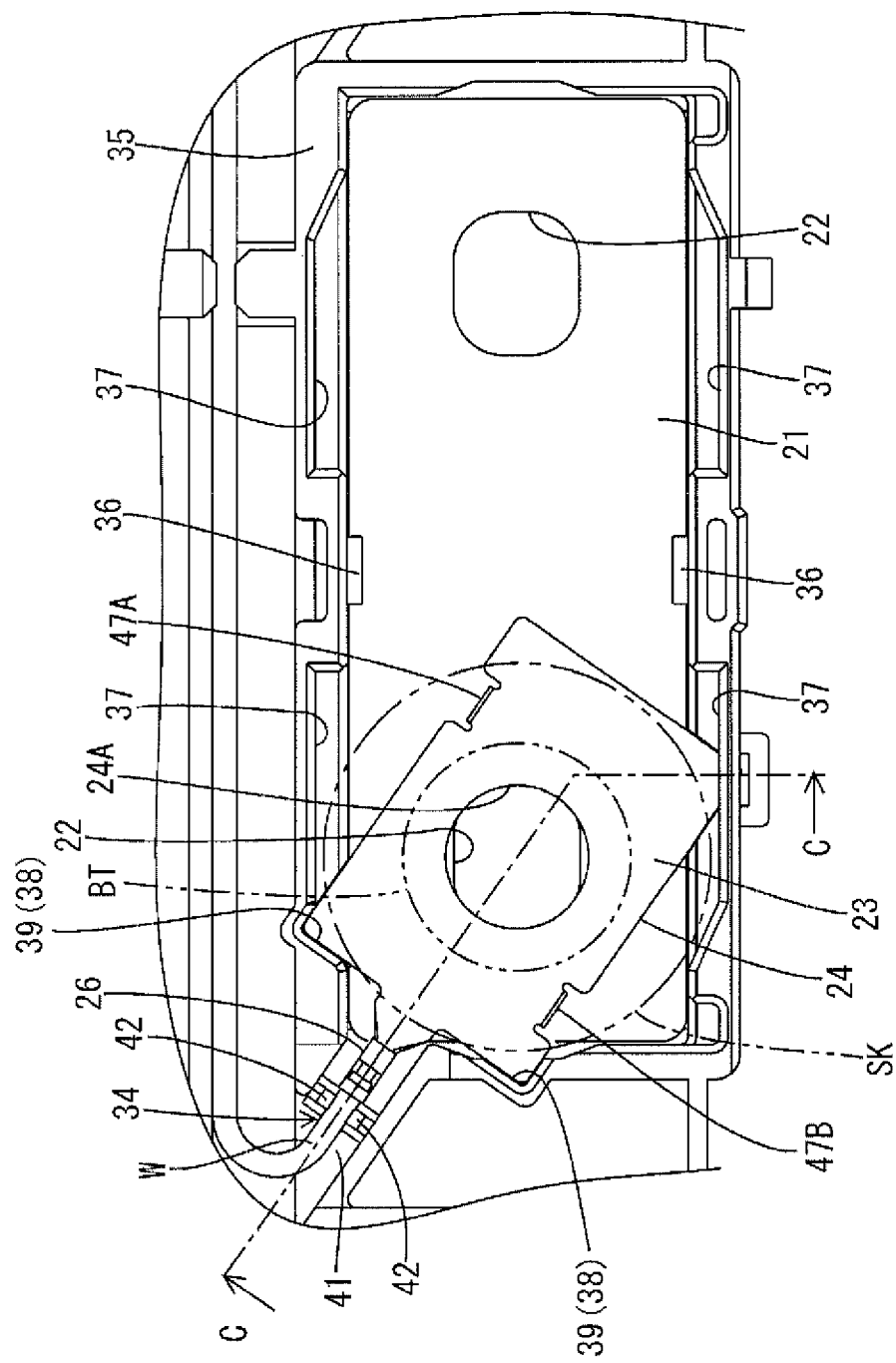
FIG. 9 is a diagram showing an enlargement of a retaining portion in which a connecting member and a first detection terminal in Embodiment 2 are retained.
Figure 10:
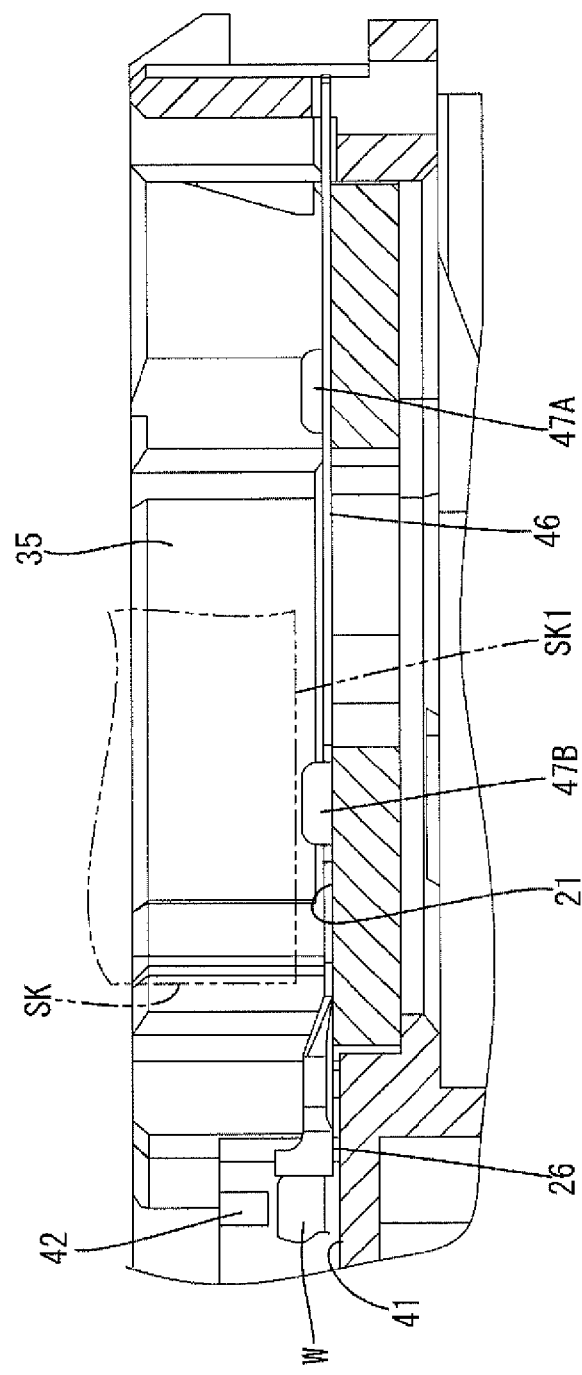
FIG. 10 is a diagram showing a cross-section taken along line C-C in FIG. 9.
Figure 13:
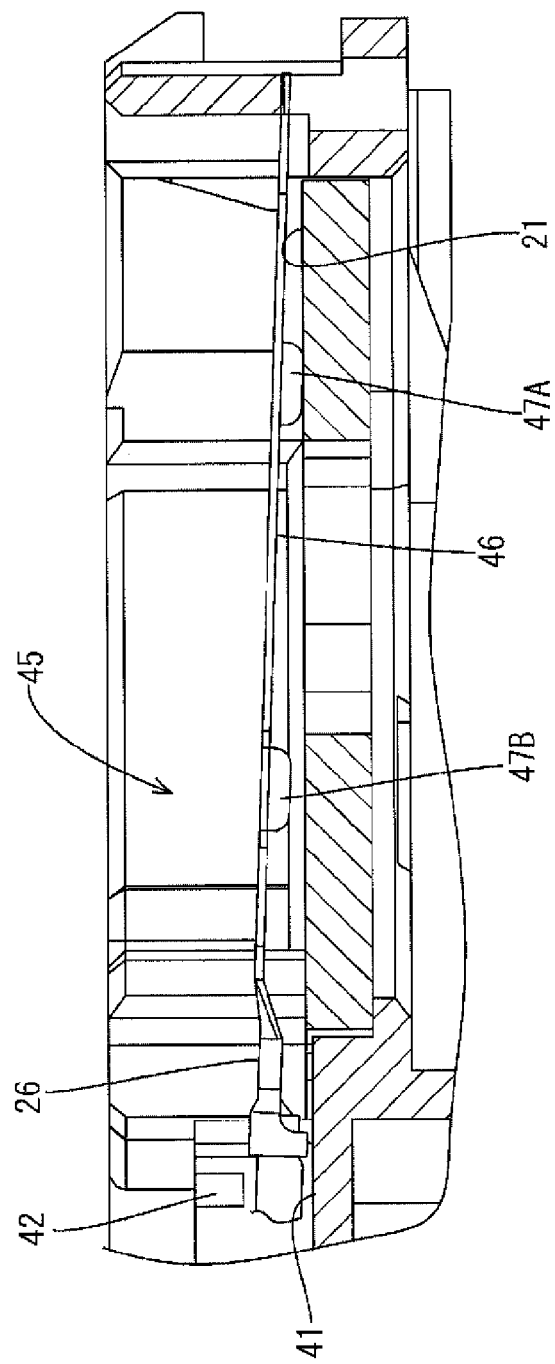
FIG. 13 is a diagram showing a state where the first detection terminal is mounted upside down.

As shown in FIG. 9, the pair of projecting pieces 47A, 47B are both provided outside (the head of) a bolt BT and inside the outer periphery of the socket SK, and the projecting dimension (height dimension) of the projecting pieces 47A, 47B is set as a dimension with which the projecting pieces 47A, 47B do not reach (do not abut against) a lower end position to which the socket SK can be lowered when fastening the bolt, as shown in FIG. 10. In Embodiment 2 as well, if the first detection terminal 45 is mounted upside down, the first electric wire connecting portion 26 side of the first detection terminal 45 is slightly uplifted with respect to the bottom surface of the passage groove 41 in accordance with the height dimension of the pair of projecting pieces 47A, 47B, as shown in FIG. 13.

According to Embodiment 2, the following effects are achieved.

The insertion hole 24A for fastening with the bolt BT (fastening member) is formed in each first detection terminal 45 (detection terminal) in a penetrating manner, and the projecting dimension of the projecting pieces 47A, 47B (projecting portion) is set to a dimension with which the projecting pieces 47A, 47B do not abut against the socket SK (fastening tool) for fastening the bolt BT.

With this configuration, when the socket SK fastens the bolt, the socket SK can be prevented from coming into contact with the projecting pieces 47A, 47B.

Embodiment 3

Figure 14:
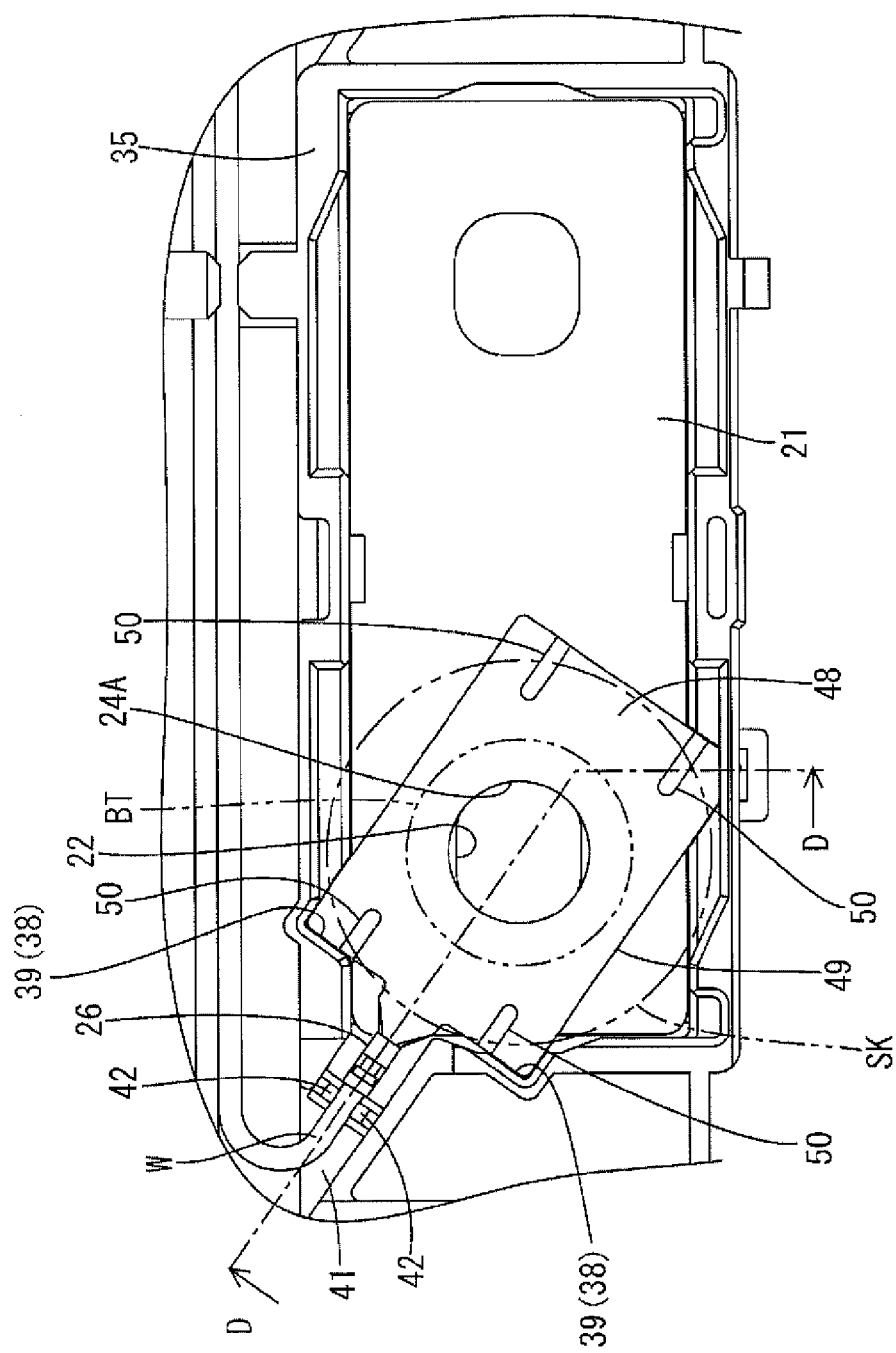
FIG. 14 is a diagram showing an enlargement of a retaining portion in which a connecting member and a first detection terminal in Embodiment 3 are retained.
Figure 15:
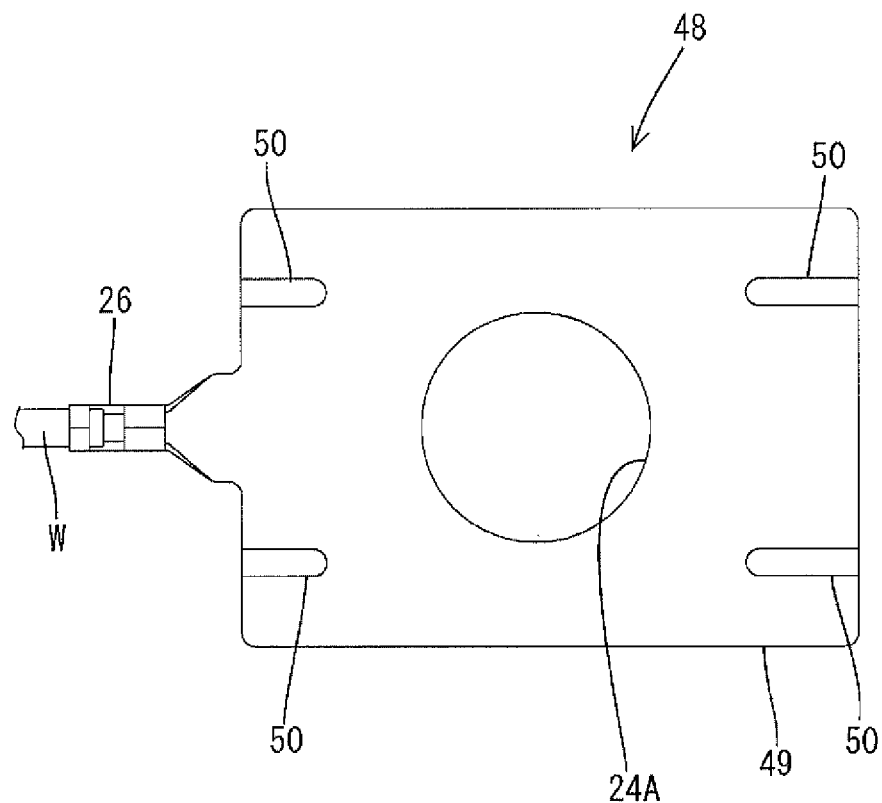
FIG. 15 is a plan view of the first detection terminal.
Figure 16:
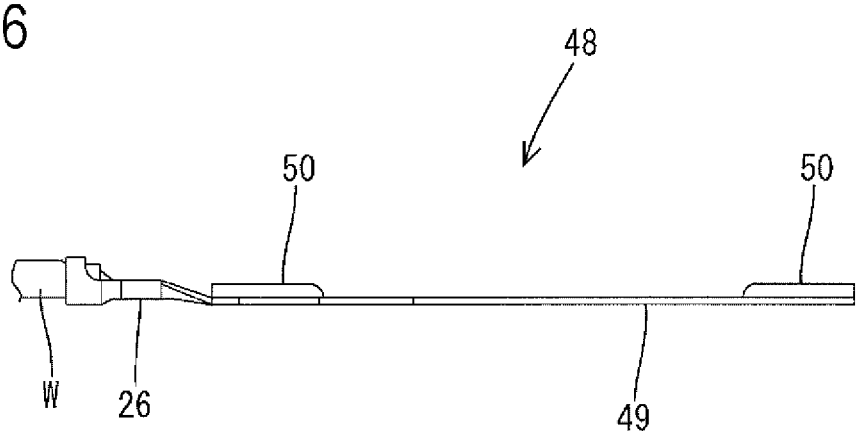
FIG. 16 is a side view of the first detection terminal.

Embodiment 3 will be described with reference to FIGS. 14 to 16. In the above embodiments, the front and back sides of the detection terminals 23, 45 are discriminated using the projecting pieces 25, 25, 47A, 47B having a plate piece shape. In contrast, in Embodiment 3, projecting portions 50 having a ridge shape (reversed U-shape) obtained by partially deforming a first plate-shaped portion 49 of each detection terminal 48 are provided such that the front and back sides of the detection terminal 48 can be discriminated, as shown in FIG. 15

A pair of projecting portions 50 are provided in a leading end portion of the first plate-shaped portion 49, and another pair of projecting portions 50 are provided in a trailing end portion of the first plate-shaped portion 46, and all projecting portions 50 extend in a direction aligned with the axial direction of the detection terminal 48.

Other Embodiments

This application is not limited to the embodiments described in the above description and the drawings, for example.

(1) Although the projecting pieces 25, 25, 47A, 47B and the projecting portions 50 are provided as the front-back discriminating means in the above embodiments, this need not be the case. For example, a mark that enables the front and back sides to be visually discriminated may be given to the first plate-shaped portion (plate-shaped portion), or a front-back discriminating means that enables the front and back sides to be discriminated by means of methods other than visual discrimination (touch etc.) may be provided. Furthermore, the detection terminal is not limited to a detection terminal whose first electric wire connecting portion 26 side is uplifted when the front and back sides are mounted in a reversed manner, and may be any kinds of detection terminal with which at least it can be discriminated that the front and back sides are reverse.

(2) Although the front-back discriminating means is provided in the first detection terminals 23 in the above embodiments, this need not be the case, and the front-back discriminating means may be provided in the second detection terminals 27. Furthermore, the front-back discriminating means may be provided in both the first detection terminals 23 and the second detection terminals 27.

(3) Although the above embodiments employ a configuration in which the wiring module 20 retains the connecting members 21 and the first detection terminals 23, this need not be the case. A configuration is also possible in which the wiring module 20 does not retain the connecting members 21 and the first detection terminals 23 and retains the second detection terminals 27. In this case, the front and back sides may be discriminated by providing the second detection terminals 27 with the projecting pieces 25, 25, 47A, 47B or the projecting portions 50 in the above embodiments.

(4) Although the connecting members 21 connect the electrode terminals 12A, 12B of the opposite polarities (series connection) in the above embodiments, this need not be the case, and the connecting members 21 may connect the electrode terminals 12A, 12B of the same polarity (parallel connection). For example, the battery module 10 in the above embodiments may be connected to still another electric cell 11 in parallel, and the electrode terminals 12A, 12B of the same polarity in this parallel connection may be connected by a plurality of connecting members 21.

(5) The number of electric cells 11 for constituting the battery module 10 is not limited to that in the above embodiments, and the shape of the wiring module 20 may also be changed as appropriate in accordance with the number of electric cells 11.

(6) Although the wiring module 20 is configured by connecting a plurality of separate coupling units in the above embodiments, this need not be the case. For example, the wiring module may be configured by a single (integrated) plate, and may retain detection terminals provided on this plate.

Although the detection terminals 23, 27 detect a voltage of the electric cells 11 in the above embodiment, the detection terminals 23, 27 may be detection terminals that detect not only voltage but other states (current etc.) of the electric cells 11.

The invention claimed is:

1. A wiring module to be attached to a battery module in which adjacent electrode terminals of a plurality of electric cells having positive and negative electrode terminals are connected by connecting members, the wiring module comprising:
   a detection terminal for detecting a state of the electric cells; and
   a resin protector that retains the detection terminal,
   wherein the detection terminal includes a plate-shaped portion having a plate shape, and an electric wire connecting portion continuous with the plate-shaped portion and connected to a terminal portion of an electric wire, and
   the plate-shaped portion is provided with a front-back discriminating means configured to distinguish between front and back sides of the detection terminal,
   the front-back discriminating means is a projecting portion that projects with respect to a surface of the plate-shaped portion,
   the plate-shaped portion is rectangular, and the projecting portion is formed at a corner portion of the plate-shaped portion,
   the resin protector is provided with a partition wall that partitions the connecting members from the outside, and
   the partition wall is provided with a bulging portion that bulges toward the outside, and inside of which the corner portion is disposed.

2. The wiring module according to claim 1, wherein the projecting portion interferes with the connecting portion when the projecting portion is incorrectly assembled.

3. The wiring module according to claim 1,
   wherein the projecting portion is a plate-shaped projecting piece that projects with respect to the surface of the plate-shaped portion.

4. The wiring module according to claim 1,
   wherein the detection terminal is provided with an insertion hole for fastening with a fastening member, the insertion hole penetrating the detection terminal, and
   the projecting portion is formed outside an area of a fastening tool for fastening the fastening member.

5. The wiring module according to claim 1,
   wherein the resin protector is provided with a retaining portion that retains the connecting members and the detection terminal, and
   the detection terminal is laid on the corresponding connecting member.

6. The wiring module according to claim 1,
   wherein the projecting portion is provided in the plate-shaped portion at a position on the electric wire connecting portion side.

7. The wiring module according to claim 1,
   wherein the detection terminal is provided with an insertion hole for fastening with a fastening member, the insertion hole penetrating the detection terminal, and
   a projecting dimension of the projecting portion is set to a dimension with which the projecting portion does not abut against a fastening tool for fastening the fastening member.

8. The wiring module according to claim 1,
   wherein the resin protector is provided with a passage groove through which a passing portion constituted by at least one of the terminal portion of the electric wire and the electric wire connecting portion is passed, and a retaining piece that retains the passing portion within the passage groove, and
   if the detection terminal is mounted upside down, the passing portion is disposed at a position where the passing portion is not retained within the passage groove.

* * * * *